United States Patent [19]

Bilakanti et al.

[11] Patent Number: 5,110,765
[45] Date of Patent: May 5, 1992

[54] SELECTIVE ETCH FOR GAAS-CONTAINING GROUP III-V COMPOUNDS

[75] Inventors: Jaya Bilakanti, Mahwah; Edward J. Laskowski, Scotch Plains, both of N.J.

[73] Assignee: AT&T Bell Laboratories, Murray Hill, N.J.

[21] Appl. No.: 621,700

[22] Filed: Nov. 30, 1990

[51] Int. Cl.$^5$ ........................... H01L 21/302
[52] U.S. Cl. ................... 437/225; 437/228; 437/234; 148/DIG. 51
[58] Field of Search ............ 437/225, 228, 234; 148/DIG. 51

[56] References Cited

U.S. PATENT DOCUMENTS 4,049,488  9/1977  Tijburg ........................... 156/655

FOREIGN PATENT DOCUMENTS 0099276  4/1989  Japan.

OTHER PUBLICATIONS

Motekatis et al., "Gallium Complexes of Multidentate Ligands in Aqueous Solution", Inorganic Chemistry, vol. 19, pp. 1646, 1980.

Tijburg et al.. "New Technological Aspects . . . Gallium Arsenide Structure", Proc. Electrochem. Soc., 88-23, 1987, pp. 657-665.

Welcher, "The Analytical Use of Ethylenediamine Tetracetic Acid", 1958, pp. 1-9.

J. J. Kelly et al., Applied Surface Science, vol. 29, (1987), pp. 149-164) North-Holland, Amsterdam,"A Study of GaAs Etching in Alkaline H$_2$O$_2$ Solutions".

Y. G. Chai et al., IEEE Electron Device Letters, vol. EDL-4, No. 7, Jul. 1983 (pp. 252-254); "In$_{0.53}$Ga$_{0.74}$As Submicrometer FETs Grown by MBE".

P. O'Connor et al., "In$_{0.53}$Ga$_{0.47}$As FET's with Insulator-Assisted Schottky Gates", IEEE Electron Device Letters, vol. EDL-3, Mar. 1982, pp. 64-66.

C. Juang et al., "Selective etching of GaAs and Al$_{0.30}$Ga$_{0.70}$As with citric acid/hydrogen peroxide solutions", J. Vacuum Science Technology, B8 (5) Sep./Oct. 1990, pp. 1122-1124.

R. K. Day, Jr. et al., Quantitative Analysis, p. 186, 1967, 2d.ed.

Primary Examiner—Brian E. Hearn
Assistant Examiner—Trung Dang
Attorney, Agent, or Firm—M. J. Urbano

[57] ABSTRACT

A solution of H$_2$O$_2$ and EDTA selectively etches GaAs-containing Group III-V compounds in the presence of other Group III-V compounds. Illustratively, Al$_y$Ga$_{1-y}$As ($y \leq 0$) is selectively etched in the presence of Al$_x$Ga$_{1-x}$As ($x > y$), and InGaAs is selectively etched in the presence of either InAlAs or InP.

10 Claims, 2 Drawing Sheets

SELECTIVE ETCH FOR GAAS-CONTAINING GROUP III-V COMPOUNDS

BACKGROUND OF THE INVENTION

This invention relates to the manufacture of Group III-V compound heterostructure devices and, more particularly, to selective etching procedures useful in such manufacture.

The availability of crystal growth technologies which provide uniform layer thickness and composition over entire 3-inch GaAs and InP wafers has allowed device designers significant freedom to utilize sophisticated structures. For example, superlattices are used to realize many new types of devices including self-enhanced electro-optic devices (SEED) and resonant tunneling bipolar transistors (RTBT). A less sophisticated device, though one of more immediate commercial impact, is the FET which uses these growth technologies to form abrupt material heterojunctions to control layer thickness, and hence the threshold voltage ($V_{th}$). More specifically, sacrificial "stop etch" layers of slightly differing composition are incorporated into the structure. Subjecting the structure to a selective etch enables etching to proceed to a known depth across the entire wafer, thereby improving $V_{th}$ uniformity and simplifying processing. For the GaAs/AlGaAs compositions some of the more commonly used wet chemical etches are $NH_4OH/H_2O_2$ at pH=7.05 (known as PA) and $KI/I_2$ (dilute) for GaAs, and $HF/H_2O$ and $KI/I_2$ (concentrated) for AlGaAs. A variety of etchants using oxidation-reduction couples with pH adjusted for reaction product solubility have been reported, but do not appear to be in general use. Reactive ion etching in a plasma containing fluorine species has also been used to remove GaAs from AlGaAs.

The PA etch has an etch rate of ~1000 Å/min. For high selectivity, the pH of this etch must be carefully controlled as selectivity drops off rapidly away from pH=7.05. Because the system is unbuffered, such control is difficult. Additionally, trenching, or rapid etching near the resist edge, is commonly observed. The latter effect, when combined with the high etch rate, makes use of this etch for layers less than 500 Å thick unreliable. The $KI/I_2$ etch, while somewhat easier to control, is less selective having a selectivity ratio (rate in GaAs/rate in AlGaAs) of only 8/1 for GaAs/$Al_{0.20}Ga_{0.80}As$. For higher Al concentrations, (e.g. $Al_{0.48}Ga_{0.52}As$) the selectivity rises to about 20/1, quite useful at that concentration. However, the $Ki/I_2$ etch also attacks gold, making it unsuitable for use in device structures where Au may be used as a mask.

In general, the wet chemical etching of a solid is viewed as a three-step process: (1) diffusion of the reactants to the solid surface, (2) reaction with the solid surface, and (3) dissolution of the reaction products. These processes are frequently complicated by the presence of surface layers such as oxides which either already exist or are formed during the course of the etching reaction, but this model has provided the basis for a variety of etches for Group III-V compound semiconductors. In the case of GaAs the active etchant is typically an oxidizing agent such as $H_2O_2$, $Cr_2O_7^{-2}$, $Br_2$, or $HNO_3$, although a variety of other oxidizing agents have been reported. The $H_2O_2$-based etches have been particularly well studies. In general, solvent systems are chosen with this reactant to promote product dissolution. Solvents include (at various concentrations in water) $H_2SO_4$, Hcl, $H_3PO_4$, and $C_6H_8O_7$ on the acidic side and NaOH and $NH_4OH$ in strongly alkaline solutions. On the other hand, J. J. Kelly et al. report in *Appl. Surf. Sci.*, Vol. 29, p. 149 (1987) the use of EDTA and $NH_4OH$ as complexing agents at mildly basic conditions to control the $H_2O_2$ etch rate of GaAs. Selective etching is not discussed. Rather, they investigated this etchant at pH ranging from 6 to 12. At low pH the reaction is limited by the acid, suggesting a surface controlled reaction dependent on dissolution of surface oxides by the acid. For pH > 12, $H_2O_2$ is strongly dissociated and becomes less effective as an oxidizing agent. From 12 > pH > 10 the dissolution of GaAs is kinetically controlled and primarily determined by the $H_2O_2$ concentration. Below pH=10, formation of oxide films inhibits the etching action and addition of complexing agents is required.

SUMMARY OF THE INVENTION

We have discovered that a solution of hydrogen peroxide ($H_2O_2$) and an anion of ethylenediaminetetraacetic acid (EDTA) in a proper pH range selectively etches GaAs-containing Group III-V compounds in the presence of other Group III-V compounds. Illustratively, $Al_yGa_{1-y}As (y \leq 0)$ is selectively etched in the presence of $Al_xGa_{1-x}As (x > y)$, and InGaAs is selectively etched in the presence of either InAlAs or InP. Preferably, the dominant species of EDTA in the solution is diprotic (i.e., $H_2EDTA^{-2}$).

The etchant is compatible with the etching of epitaxial layers with other etchants (e.g., HF for AlGaAs) and can be conveniently used in fabricating device structures (e.g., self-aligned structures) using conventional masking and contact materials. In the latter regard, photoresist, gold an gold/germanium alloys are not significantly attached by the etchant.

BRIEF DESCRIPTION OF THE DRAWING

Our invention, together with its various features and advantages can be readily understood from the following more detailed description taken in conjunction with the accompanying drawing, in which.

DETAILED DESCRIPTION

The following examples describe in detail the use of a solution of diprotic EDTA (derived from $Na_2$ EDTA) and $H_2O_2$ in water as a selective etch for three combinations of materials: GaAs in the presence of $Al_xGa_{1-x}As$, InGaAs in the presence of InAlAs, and InGaAs in the presence of InP. The GaAs example is a special case of $Al_yGa_{1-y}As$ in the presence of $Al_xGa_{1-y}As$ in which y=0 and is supported by the data showing that the selectivity ratio (FIG. 4) varies as a function of aluminum mole fraction.

Unless otherwise stated, various materials, parameters, dimensions and the like are illustrative only and are not to be construed as limitations on the scope of the invention.

Polished semi-insulating GaAs wafers were obtained from commercial sources. Epitaxial wafers of varying compositions were grown by the MBE technique. Different structures having a variety of layer compositions and layer thicknesses were fabricated. For example, single layers of AlGaAs on GaAs substrates; double layers of GaAs and AlGaAs; triple layers of GaAs/AlGaAs/GaAs; triple layers of AlGaAs/GaAs/AlGaAs; quadruple layers of AlGaAs/GaAs/AlGaAs/GaAs. Aluminum mole fractions varied from 0.08 to 0.60 in the AlGaAs layers. Thicknesses ranged from 100 Å to more than 6000 Å depending on the layer and the structure. Wafers were patterned with Az 1350J resist (purchased from Hoechst-Celanese Corporation of Somerville, N.J.). Residual resist after development was removed using a low power $O_2$ plasma. $H_2O_2$ (30%, MOS electronic grade) and $Na_2EDTA$ (certified ACS grade) were obtained commercially from various sources and used without further purification. All other chemicals used were ACS Reagent grade.

Figure 1:
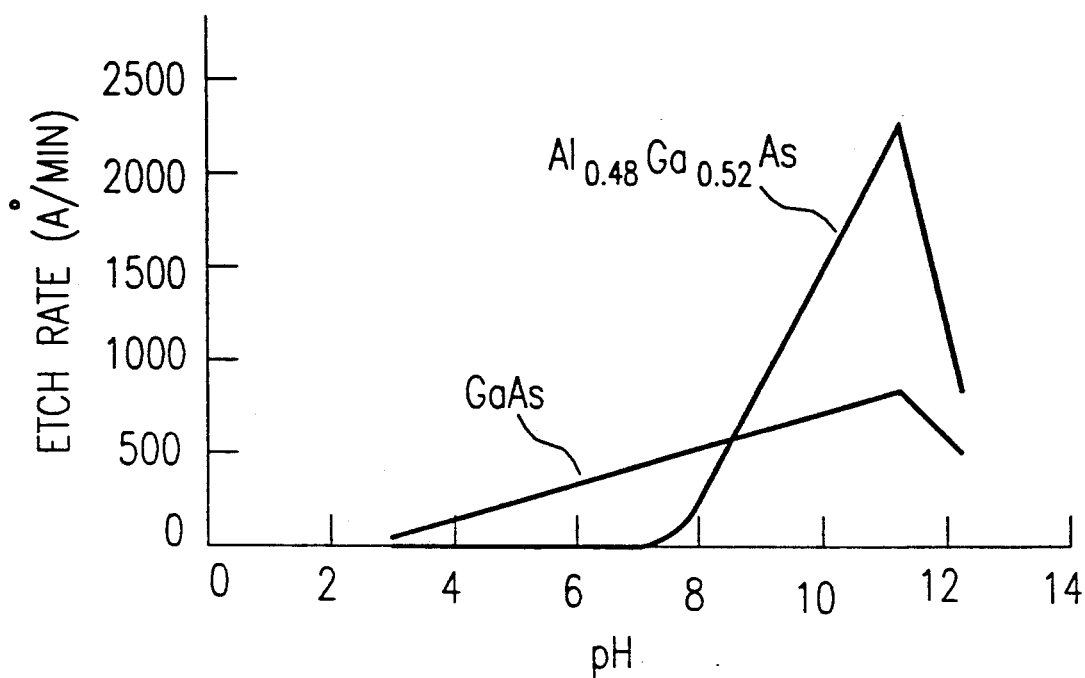
FIG. 1 is a graph showing etch rate as a function of pH for a solution of 0.049M $H_2O_2$ in 0.05M $Na_2EDTA$.
Figure 2:
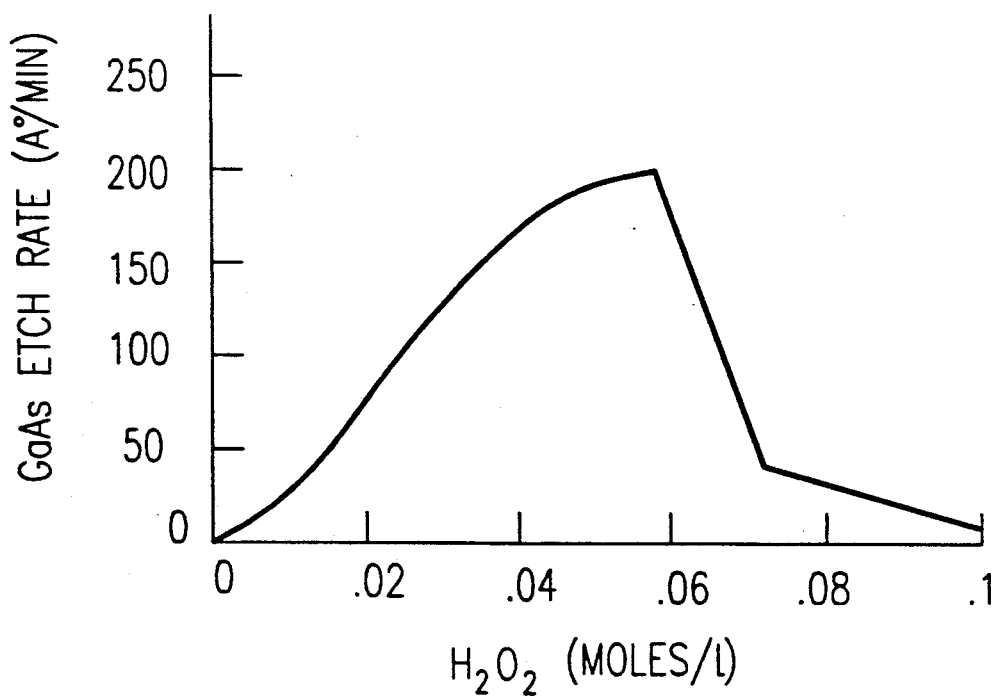
FIG. 2 is a graph showing etch rate of GaAs as a function of $H_2O_2$ concentration. Solution contains 0.05M $Na_2EDTA$ at pH=4.5.
Figure 3:
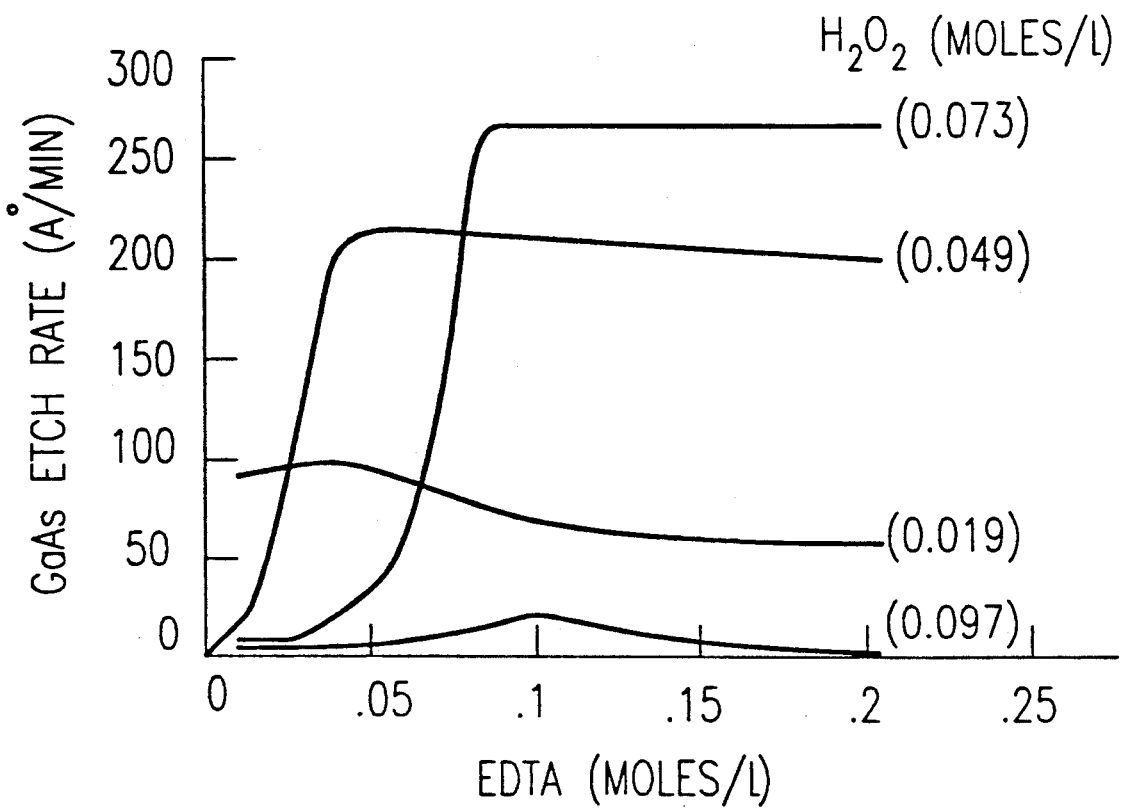
FIG. 3 is a graph showing etch rate of GaAs as a function of $Na_2EDTA$ concentration for varying concentrations of $H_2O_2$. Solution pH=4.25.

The performance of our etch relies principally on the control of three parameters: pH, peroxide concentration, and EDTA concentration. FIGS. 1-3 show the effects of varying these parameters.

EXAMPLE I

In FIG. 1 the pH dependence is illustrated. In these experiments the EDTA concentration was held constant at 0.05M and the $H_2O_2$ concentration was 0.049M. The wafers used for etching were pieces from a polished, undoped GaAs substrate and from epitaxially grown undoped $Al_{0.48}Ga_{0.52}As$. Good selectivity is obtained for $3 \lesssim pH \lesssim 7$, but $4 \lesssim pH \lesssim 6$ is preferred. The etch rate of GaAs increases with pH up to pH~ 10.5. The AlGaAs is essentially unetched for $3 \lesssim pH \lesssim 7$. At higher pH the etch rate of AlGaAs increases much more rapidly than for GaAs, and the selectivity is inverted above pH=8.5. Solutions with pH<3 could not be tested due to precipitation of $H_4EDTA$, the fully protonated form of EDTA. In the pH range where selectivity for GaAs is exhibited, the diprotic dianion, $H_2EDTA^{-2}$ is the dominant solution species.

EXAMPLE II

FIG. 2 gives the etch rate in GaAs as a function of $H_2O_2$ concentration at pH=4.5 in 0.05M $Na_2EDTA$. Up to about 0.058M in $H_2O_2$ the etch rate increases monotonically with a nearly linear increase up to about 0.0388M. In this low concentration range, the etch rate appears to be controlled by the peroxide concentration in a nearly first order fashion. At peroxide concentrations above about 0.06M the etch rate falls precipitously. Addition of $Na_2EDTA$ restores the reactivity of the etchant unless a large excess of $H_2O_2$ is present.

EXAMPLE III

FIG. 3 illustrates the dependence of the etch rate on the concentration of $Na_2EDTA$ for a variety of peroxide concentrations. The solutions have $pH=4.25\pm0.05$. The previously noted dependence of etch rate on $H_2O_2$ concentration is observed at high EDTA concentrations with the etch rate increasing with $H_2O_2$ concentration to a value of about 0.073M and then dropping rapidly. For dilute solutions of EDTA the behavior is more complex. For a given $H_2O_2$ concentration, a critical amount of EDTA should be present for significant etching to be observed. This amount increases with increasing $H_2O_2$ concentration (e.g., above about 0.02M EDTA for 0.049M $H_2O_2$ and above about 0.075M EDTA for 0.073M $H_2O_2$).

It is our understanding that EDTA acts to complex the oxidized species. Apparently the kinetics of the product removal step are slower than the rate of surface oxidation so that at high enough $H_2O_2$ concentration the build-up of poorly soluble oxidized species at the surface is sufficiently rapid to reduce the rate of the reaction. There appears to be a slight fall-off in the etch rate for very large concentrations of EDTA.

EXAMPLE IV

Because of the ease of solution preparation, the remaining examples focus on an etchant formulation using 0.049M $H_2O_2$ in 0.05M $Na_2EDTA$. The pH of this solution as prepared is about 4.5, and the $H_2O_2$ concentration as prepared gives nearly optimum etch rates without requiring great care during solution preparation to avoid addition of excess $H_2O_2$. For those applications which require higher rates and/or selectivity, adjustment of the solution pH to about 6.5 might be required, but from a manufacturability viewpoint, this composition is preferred.

Figure 4:
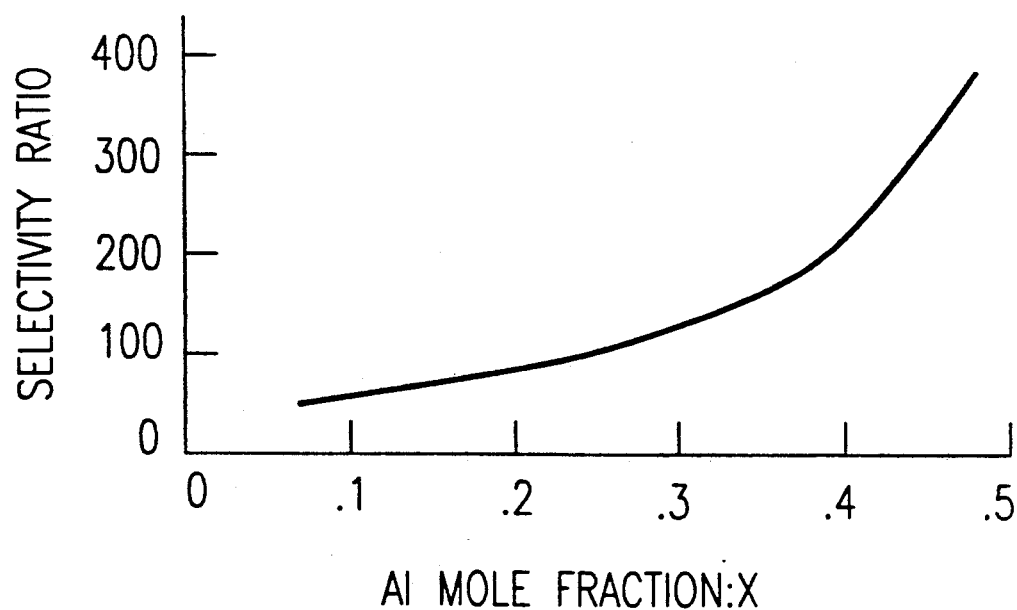
FIG. 4 is a graph showing selectivity ratio as a function of Al content for $Al_xGa_{1-x}As$ over the composition range $0.08 \lesssim x \lesssim 0.48$. Etchant composition is 0.049M $H_2O_2$ in 0.05M $Na_2EDTA$ at pH=4.5.

Etch rates for various $Al_xGa_{1-x}As$ compositions were determined over the range $0 \lesssim x \lesssim 0.48$ by determining the slope of plots of etch depth vs. time in the various materials. The selectivity ratio, defined as the etch rate in GaAs divided by the etch rate in AlGaAS is shown in FIG. 4. For etching GaAs, the rate is essentially constant with time, though for the longest etches tested there is a slight decrease. The etch rate is independent of solution agitation, indicating that the reaction is limited by reaction rate rather than under diffusion control.

Selective etching was also demonstrated for x as high as about 0.60, and we expect good selectivity for compositions up to x=1 (i.e., AlAs).

EXAMPLE V

It is worthwhile noting that after etches as long as 4 hours used in some of the above experiments, no attack of the AZ 1350J photoresist was observed. The solution did not attach gold or gold/germanium alloys. However, titanium is attacked, as evidenced by lifting of metalizations which employ that metal as a barrier layer.

EXAMPLE VI

Several tests were conducted to confirm that the $EDTA/H_2O_2$ etch is compatible with processes using heterojunctions as etch stops, e.g., in the fabrication of field effect transistors (FETs). Compatibility was demonstrated by showing that (1) the surface left after etching an AlGaAs layer (e.g., with HF) can subsequently be etched with the $EDTA/H_2O_2$ solution, (2) an etch depth equal to the sum of the thickness of the top two layers (i.e., AlGaAs/GaAs layers on AlGaAs) of the device structure is reliably obtained even after long overetches with $EDTA/H_2O_2$, and (3) the surface left after the $EDTA/H_2O_2$ etch can be reproducibly etched by AlGaAs etches (e.g., HF) even when samples are allowed to "age" in air for over 1 week.

EXAMPLE VII

The EDTA/$H_2O_2$ etch is also useful for removing InGaAs selectively from either InAlAs of InP. Lattice matched compositions were used; i.e., $In_{0.53}Ga_{0.47}As$ and $In_{0.52}Al_{0.48}As$. Using a pH of about 4.5 and the concentrations of Example I, we find that the etch rate for p-InGaAs (doped 1E19) to be 200 Å/min. whereas the etch rate for p-In AlAs is less than 1 Å/min. Similar results are obtained with n-type and undoped materials. The etch rate in InP is <1 Å/min. Very rapid etching of InAs, on the order of 700 Å/min., was also observed.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, in the preceding examples, the diprotic form of EDTA is preferred because the solution pH does not have to be adjusted to bring it into the proper range for selective etching; i.e., it is automatically buffered by the dominant $H_2EDTA^{-2}$ species. Thus, the pH of the solution is highly stable. However, the diprotic species need not be derived from the disodium salt, rather it could just as well be derived from other Group I salts (e.g., Li, K) or from Group II salts (e.g., Mg, Ca) of EDTA or from fully protonated EDTA acid itself. Moreover, while other species of EDTA could be used, they are not presently preferred because these forms require the addition of relatively large amounts of acid or base to reach the desired pH.

We claim:

1. A method of making a semiconductor device comprising
   fabricating a structure which includes a pair of Group III-V compound regions having different compositions,
   at least one of said regions comprising GaAs, characterized in that
   said structure is subjected to an etchant comprising a solution of an anion of EDTA and $H_2O_2$ with a pH in the range of approximately 4 to 6 so that said one region is selectively etched, wherein the concentration of EDTA in said solution is above a value in the range of 0.02–0.075 moles/liter when the concentration $H_2O_2$ in said solution is in the range of 0.049–0.073 moles/liter.

2. The method of claim 1 wherein the dominant species of EDTA in said solution is diprotic.

3. The method of claim 1 wherein said solution comprises an aqueous solution of a Group I or Group II salt of EDTA and $H_2O_2$.

4. The method of claim 1 wherein said other region comprises a compound selected from the group consisting of $Al_xGa_{1-x}As(y<x)$, InAlAs and InP.

5. The method of claim 1 wherein said one region comprises a GaAs epitaxial layer.

6. The method of claim 1 wherein said one region comprises a GaAs substrate.

7. The method of claim 1 wherein said structure includes a non-semiconductor layer selected from the group consisting of gold, gold/germanium alloys and photoresist, which is not significantly etched by said etchant.

8. The method of any one of claims 1 to 3, 4 and 5 to 7 wherein said other region comprises $Al_xGa_{1-x}As$ and $0.08 \lesssim x \lesssim 0.60$.

9. A method of fabricating a semiconductor device comprising
   fabricating a Group III-V compound heterostructure which includes contiguous first and second epitaxial layers having different compositions,
   said first and second layers comprising, respectively, $Al_yGa_{1-y}As$ and $Al_xGa_{1-y}As$ ($0 \leq y < x$), and
   subjecting said heterostructure to an etchant comprising a solution of diprotic EDTA and $H_2O_2$ in water at a pH in the range of approximately 4 to 6 which selectively etches said first layer, wherein the concentration of EDTA in said solutions is above a value in the range of 0.02–0.075 moles/liter when the concentration $H_2O_2$ in said solution is in the range of 0.049–0.073 moles/liter.

10. The method of claim 9 wherein said diprotic EDTA is derived from $Na_2EDTA$.

* * * * *